United States Patent
Tan

(10) Patent No.: US 9,373,567 B2
(45) Date of Patent: Jun. 21, 2016

(54) LEAD FRAME, MANUFACTURE METHOD AND PACKAGE STRUCTURE THEREOF

(71) Applicant: Silergy Semiconductor Technology (Hangzhou) LTD, Hangzhou, ZheJiang Province (CN)

(72) Inventor: Xiaochun Tan, ZheJiang Province (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 0 days.

(21) Appl. No.: 14/459,515

(22) Filed: Aug. 14, 2014

(65) Prior Publication Data

US 2015/0048491 A1 Feb. 19, 2015

(30) Foreign Application Priority Data

Aug. 14, 2013 (CN) .......................... 2013 1 0353446

(51) Int. Cl.
*H01L 23/495* (2006.01)

(52) U.S. Cl.
CPC .......... *H01L 23/4952* (2013.01); *H01L 23/495* (2013.01); *H01L 23/49575* (2013.01); *H01L 23/49513* (2013.01); *H01L 2224/16245* (2013.01); *H01L 2224/32145* (2013.01); *H01L 2224/32245* (2013.01); *H01L 2224/48247* (2013.01); *H01L 2224/73265* (2013.01); *H01L 2924/1305* (2013.01); *H01L 2924/13091* (2013.01)

(58) Field of Classification Search
CPC ... H01L 21/98; H01L 23/34; H01L 23/49816; H01L 23/4951; H01L 23/4952
See application file for complete search history.

(56) References Cited

U.S. PATENT DOCUMENTS

| | | | |
|---|---|---|---|
| 8,283,758 B2 | 10/2012 | Jiang | |
| 8,294,256 B2 | 10/2012 | Chen et al. | |
| 2006/0246629 A1* | 11/2006 | Shim et al. | 438/123 |
| 2007/0130759 A1 | 6/2007 | Harnden | |
| 2011/0042798 A1* | 2/2011 | Pagaila et al. | 257/692 |
| 2012/0153447 A1* | 6/2012 | Jiang | 257/673 |
| 2012/0299170 A1* | 11/2012 | Kehrer et al. | 257/673 |
| 2013/0134567 A1 | 5/2013 | Tan | |
| 2013/0134568 A1 | 5/2013 | Tan | |
| 2013/0181304 A1* | 7/2013 | Milano et al. | 257/421 |
| 2014/0159218 A1 | 6/2014 | Tan | |
| 2014/0202736 A1* | 7/2014 | Xing | H05K 1/02 174/250 |

FOREIGN PATENT DOCUMENTS

CN 1499589 A 5/2004

* cited by examiner

*Primary Examiner* — Peniel M Gumedzoe
(74) *Attorney, Agent, or Firm* — Michael C. Stephens, Jr.

(57) ABSTRACT

Disclosed herein are various chip lead frame and packaging structures, and methods of fabrication. In one embodiment, a lead frame can include: (i) a horizontal plate arranged at a bottom of the lead frame, where the horizontal plate is conductive; and (ii) a plurality of conductive bumps arranged on a surface of the horizontal plate, where the plurality of conductive bumps are configured to support and electrically connect to at least one chip. In one embodiment, a method of making the lead frame can include: (i) forming the horizontal plate by a mold; (ii) arranging a mask with a through-hole on the surface of the horizontal plate; (iii) electroplating conducting material on a portion of the horizontal plate that is exposed by the through-hole; and (iv) removing the mask after formation of the plurality of conductive bumps. Also, a package structure can be formed using the lead frame.

10 Claims, 8 Drawing Sheets

LEAD FRAME, MANUFACTURE METHOD AND PACKAGE STRUCTURE THEREOF

RELATED APPLICATIONS

This application claims the benefit of Chinese Patent Application No. 201310353446.8, filed on Aug. 14, 2013, which is incorporated herein by reference in its entirety.

FIELD OF THE INVENTION

The present invention relates to integrated circuit packaging technologies, and more particularly relates to a lead frame structure, associated manufacturing, and a package structure utilizing the lead frame.

BACKGROUND

Various packaging structures can employ lead frames, such as integrated circuit (IC) package structures. For example, and IC package structure can be utilized to house and seal an IC die or "chip," or multiple such chips. In addition, and IC package structure can electrically connect the IC die/chip to a printed-circuit board (PCB) or other structure for external connection.

SUMMARY

In one embodiment, a lead frame can include: (i) a horizontal plate arranged at a bottom of the lead frame, where the horizontal plate is conductive; and (ii) a plurality of conductive bumps arranged on a surface of the horizontal plate, where the plurality of conductive bumps are configured to support and electrically connect to at least one chip. In one embodiment, a method of making the lead frame can include: (i) forming the horizontal plate by a mold; (ii) arranging a mask with a through-hole on the surface of the horizontal plate; (iii) electroplating conducting material on a portion of the horizontal plate that is exposed by the through-hole; and (iv) removing the mask after formation of the plurality of conductive bumps. Also, a package structure can be formed using the lead frame.

Embodiments of the present invention can provide several advantages over conventional approaches, as may become readily apparent from the detailed description of preferred embodiments below.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Microelectronic packages can include microelectronic circuits or components, thin-film recording heads, data storage elements, microfluidic devices, and/or other components manufactured on microelectronic substrates. Microelectronic substrates can include semiconductor pieces (e.g., doped silicon wafers, gallium arsenide wafers, etc.), non-conductive pieces (e.g., various ceramic substrates), or conductive pieces (e.g., metal or metal alloy). A semiconductor die or chip is used throughout to include a variety of articles of manufacture, including, e.g., an individual integrated circuit die/chip, an imager die/chip, a sensor die/chip, and/or chips having other semiconductor features.

Figure 1:
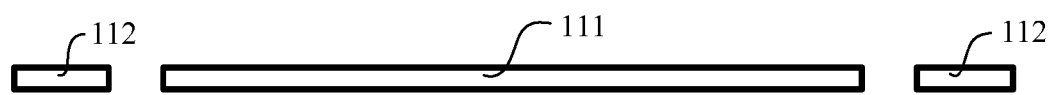
FIG. 1 is a cross-section diagram of an example lead frame structure.

Referring now to FIG. 1, shown is a cross-section diagram of an example lead frame structure. This particular lead frame can include chip tray 111 and lead 112. For example, the top surface and the bottom surface of chip tray 111 and lead 112 may be a planar structure, and the overall structure of such a lead frame can be configured as a "flake" structure, or any other suitable type of structure.

Figure 2:
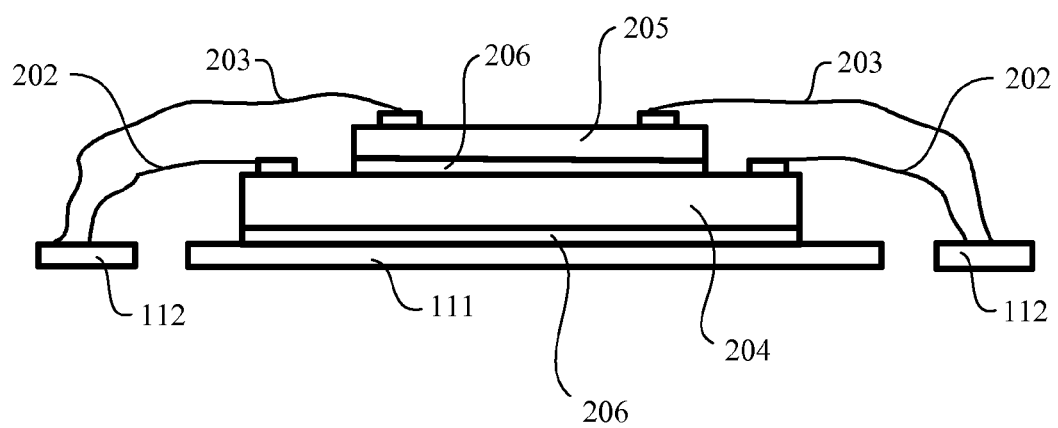
FIG. 2 is a cross-section diagram of an example package structure.

Referring now to FIG. 2, shown is a cross-section diagram of an example package structure. When such a lead frame is applied in a multiple die/chip stack package structure as shown in FIG. 2, die 204 and die 205 may be stacked on chip tray 111 of the lead frame. One surface of die 204 can be connected to a connection surface of chip tray 111 through adhesive 206. One surface of die/chip 205 can be connected to the other surface of die 204 through adhesive 206. For example, a width of die 205 can be less than a width of die 204 to expose the pads at edges of die 204. Also, bonding wires may be utilized to form electrical connection between pads on a die and the lead frame in the multiple chip stack package structure shown. Bonding wires 202 and 203 can be utilized to electrically connect pads on chips 204 and 205 to lead 112 of the lead frame in the example package structure. Also, the height of bonding wire 103 can be greater than that of die 205 in this particular example.

However, in some applications the thickness of the package body of this example lead frame may be too high to meet various requirements of semiconductor package density as to miniaturization, light weight, and multifunctional capabilities of electronic components. Further, the high frequency performance of the chips may be decreased by interference from intrinsic inductance and/or resistance of the bonding wires of the package structure. In particular embodiments, the thickness of the chip package structure can be decreased by way of chip package structure, lead frame design, and associated manufacturing approaches, in order to satisfy the miniaturization requirements of various electronic components.

In one embodiment, a lead frame can include: (i) a horizontal plate arranged at a bottom of the lead frame, where the horizontal plate is conductive; and (ii) a plurality of conductive bumps arranged on a surface of the horizontal plate, where the plurality of conductive bumps are configured to support and electrically connect to at least one chip. In one embodiment, a method of making the lead frame can include: (i) forming the horizontal plate by a mold; (ii) arranging a mask with a through-hole on the surface of the horizontal plate; (iii) electroplating conducting material on a portion of the horizontal plate that is exposed by the through-hole; and (iv) removing the mask after formation of the plurality of conductive bumps. Also, a package structure can be formed using the lead frame.

Figure 3:
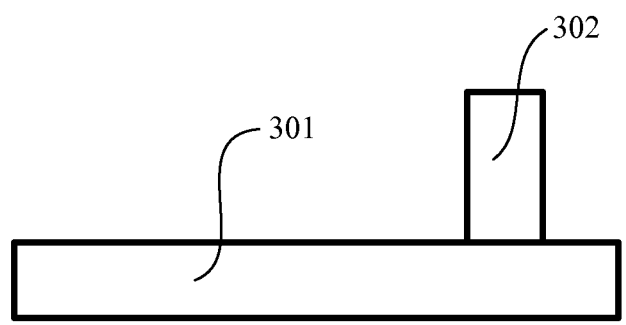
FIG. 3 is a cross-section diagram of an example lead frame, in accordance with embodiments of the present invention.

Referring now to FIG. 3, shown is a cross-section diagram of an example lead frame, in accordance with embodiments of the present invention. This example lead frame can include horizontal plate 301 and multiple bumps 302, which each can include a conductive material. Horizontal plate 301 can be arranged on a bottom of the entire lead frame structure.

Of course, "horizontal," "vertical," "top," and "bottom," and other such terms of orientation can be with respect to other features in the structure, or arranged as per the drawings where appropriate, and are not intended as limiting to a particular orientation of the overall structure. Also, bumps 302 can be arranged on a surface (e.g., a top surface) of horizontal plate 301 to carry and support the chip(s), and to achieve electrical connectivity between the chips and the lead frame. For example, bumps 302 can be connected to an electrical surface (e.g., a metal layer or pad) of the chips.

For example, when the lead frame is connected to chips, horizontal plate 301 can be arranged horizontally, and multiple bumps 302 can be arranged on a top surface of horizontal plate 301 vertically to achieve electrical connectivity as to or between the chips. In some cases, the material of horizontal plate 301 and bumps 302 can be a same conducting material, while in other cases, different conducting materials can be employed for the horizontal plate and the bumps. Also, the quantity and size of bumps 302 arranged on horizontal plate 301 can be determined by the specific package structure and/or application. Further, bumps 302 can be formed by a single conducting material, or by stacking multiple conducting materials and/or alloys.

This example lead frame can include bumps 302 to support a chip arranged on bumps 302, and to achieve electrical connectivity between the chip(s) and bumps 302. This approach can avoid various negative effects to chip performance that may be due to wire bonding, such as parasitic inductance of the bond wires. In this way, improved mechanical and/or electrical stability can be achieved with respect to the package structure. Also, the relatively compact nature of the package structure can also decrease the overall thickness to further miniaturization of electronic components.

Figure 7:
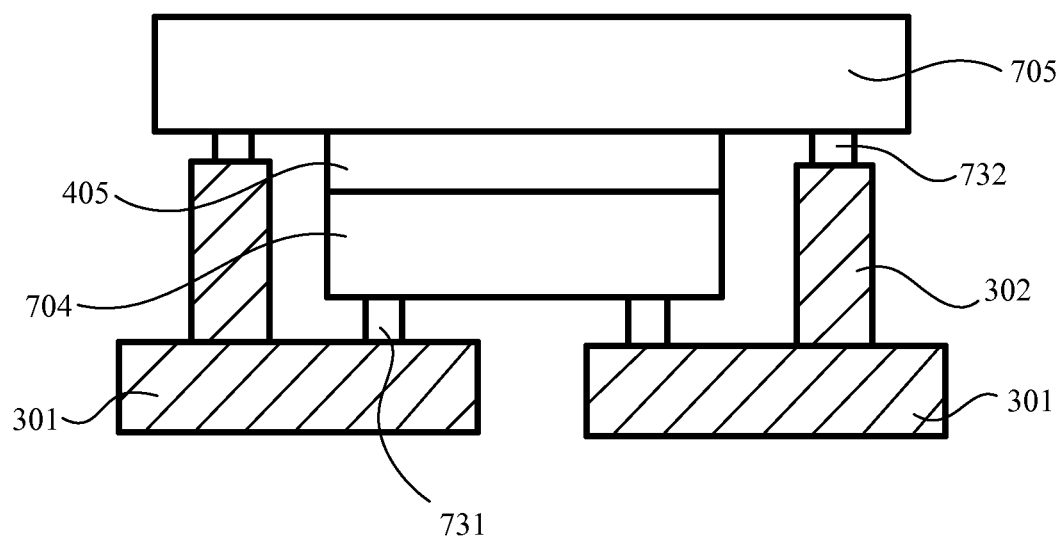
FIG. 7 is a cross-section diagram of an example chip package structure employing the lead frame, in accordance with embodiments of the present invention.

As shown in the example chip package structure of multiple components of FIG. 7, the components may be connected in a "flip" of flip-chip form, such as in a flip-chip package. Electrical connectivity between the lead frame and one or more "upper" components can be achieved by bumps 302. Thus, the thickness of the chip package structure of multiple components can be decreased relative to conventional approaches, and by avoiding bonding wires, better mechanical and/or electrical stability can be achieved.

Figure 4:
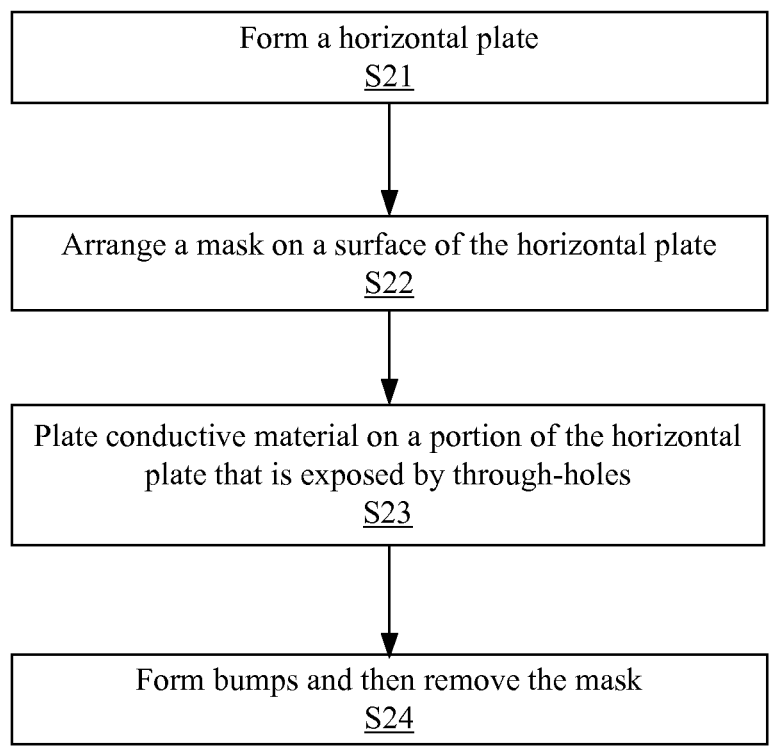
FIG. 4 is a flow diagram of an example method of plating the lead frame, in accordance with embodiments of the present invention.

Various manufacturing or processing methods can be employed to make the lead frame and/or package structure of particular embodiments. Among such manufacturing methods or process steps in forming the lead frame are plating, stamping, and etching. Referring now to FIG. 4, shown is a flow diagram of an example method of plating the lead frame, in accordance with embodiments of the present invention. At S21, the horizontal plate (e.g., 301) can be formed. For example, horizontal plate 301 can be manufactured by a specific or predetermined mold. A "mold" can be a hollow form or matrix for shaping the horizontal plate, or other structure.

At S22, a mask (e.g., a photolithographic mask) can be arranged on a surface of the horizontal plate. Specifically, the mask can include through-hole shapes to expose the surface of the horizontal plate via photoresist material, as in standard photolithographic processing. At S23, conductive material can be plated or otherwise deposited (e.g., sputtered) on a portion of horizontal plate that is exposed by through-holes. Bumps (e.g., 302) can be formed on the surface of horizontal plate 301 after plating, such as for a predetermined time interval. For example, the conductive material to form bumps 302 can include copper in the plating process. At S24, the mask or photoresist layer can be removed after bumps 302 are formed.

Figure 5:
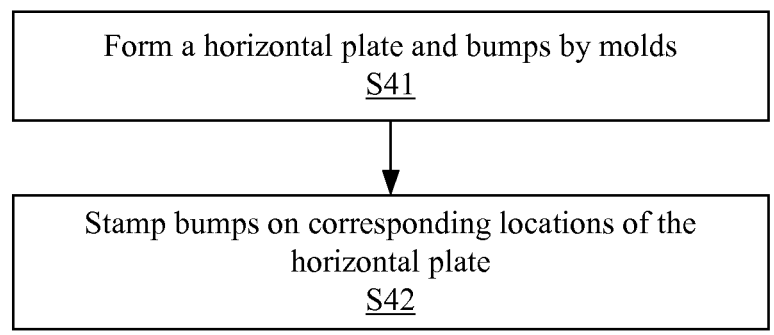
FIG. 5 is a flow diagram of an example method of stamping the lead frame, in accordance with embodiments of the present invention.

Referring now to FIG. 5, shown is a flow diagram of an example method of stamping the lead frame, in accordance with embodiments of the present invention. At S41, a horizontal plate (e.g., 301) and bumps (e.g., 302) can be formed by using molds, such as separately by specific molds. At S42, bumps 302 can be stamped on corresponding locations of horizontal plate 301. Specifically, bumps 302 can be connected to a surface of horizontal plate 301 separately by a stamping process to form the lead frame with bumps 302. Also, bumps 302 on the lead frame can be formed by stacking multiple conducting bump units, each of which can be formed by a different conducting material.

Figure 6:
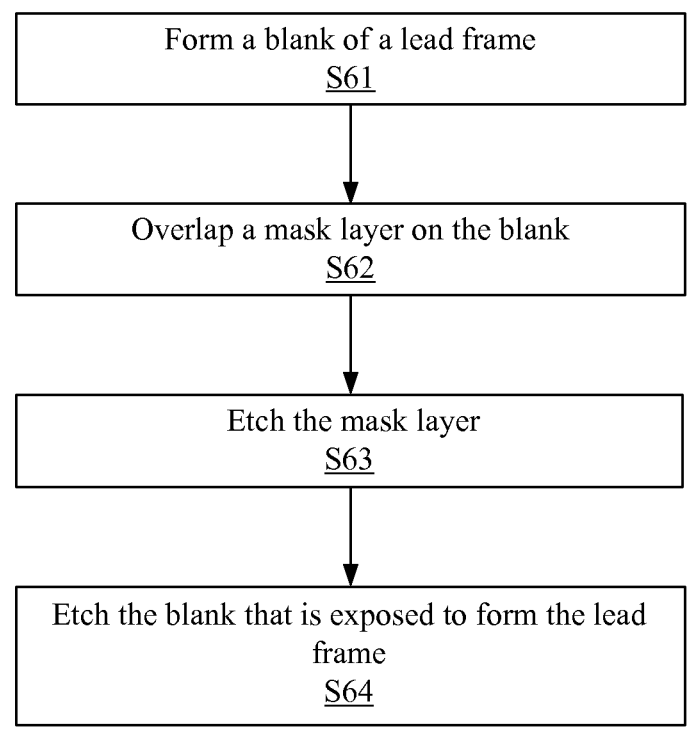
FIG. 6 is a flow diagram of an example method of etching the lead frame, in accordance with embodiments of the present invention.

Referring now to FIG. 6, shown is a flow diagram of an example method of etching the lead frame, in accordance with embodiments of the present invention. At S61, a blank of the lead frame can be formed. The blank can include an entire structure of the lead frame as manufactured by a mold. The bottom size of the blank can be consistent with a bottom size of horizontal plate 301. Also, a thickness of the blank can be consistent with a sum of the thickness of horizontal plate 301 and the height of bump 302 (e.g., at a maximum height). Also for example, the material of the blank can include copper.

At S62, a mask layer can be overlapped on the blank. For example, mask layers can be overlapped on the top and bottom surfaces of the blank. At S63, the mask layer can be etched at portions of the mask layer on the top surface of the blank to be exposed. At S64, exposed portions of the blank can be etched to form the lead frame. The surface of the blank that is exposed can be etched, and substantially all the mask layer or resist material may be removed to form the lead frame, including horizontal plate 301 and bump(s) 302.

Referring now to FIG. 7, shown is a cross-section diagram of an example chip package structure employing the lead frame, in accordance with embodiments of the present invention. This example chip package structure of multiple components utilizing the above lead frame can include the lead frame arranged at the bottom, chip 704 arranged on the lead frame, and magnetic component 705 (e.g., an inductor). In this example, chip 704 can be electrically connected to horizontal plate 301 of the lead frame by bumps 731. Magnetic component or inductor 705 can be electrically connected to bumps 302 of the lead frame by bumps 732.

Bumps 302 can be arranged outside of (e.g., peripheral to) bumps 731, and may be isolated from chip 704. Bumps 731 and 732 can be any suitable shape (e.g., spherical, rectangular, cylindrical, etc.), and bumps 731 and 732 can be formed of any suitable material (e.g., copper, tin, nickel, various alloys thereof, etc.).

In this example, the chip package structure of multiple components can also include adhesive layer 405 between chip 704 and magnetic component or inductor 705 to affix the lead frame, chip 704 and inductor 705 to achieve soundness of the entire chip package structure. Also, the polarity or circuit connections of different components can be coupled to horizontal plate 301 or bumps 302 of the lead frame through bumps 731 and/or 732 such that the lead frame has corresponding polarities coupled to external circuitry.

For the chip package structure of multiple components as shown in the example of FIG. 7, the components may be connected in a flip form or "flip-chip" type of package. Electrical connectivity between the lead frame and the upper components can be achieved by bumps 302. Thus, the thickness of the chip package structure of multiple components can be decreased significantly, as compared to conventional approaches. Further, by avoiding the use of bonding wires, chip performance, as well as mechanical and/or electrical stability, can be improved.

In addition, for magnetic components, the inductor and the chip can be packaged in a single package structure by way of a stacked package structure to accommodate inductors of relatively large size and greater inductance, in order to facilitate integration and miniaturization of components. For example, the material of the pad can include aluminum, an aluminum alloy, or any other suitable conductive material.

Also in particular embodiments, one or more isolation layers for protecting inner circuitry of a chip can be included in/on the chip or chip package structure. The isolation layer can be a passivation layer, and may be formed by, e.g., silicon nitride or silicon oxide, and can be used to protect the chip(s) from corrosion and other damage. For example, a semiconductor passivation technique can utilise a plasma enhanced chemical vapor deposition (PECVD) process to produce a silicon-rich nitride film as a passivation layer. A flip-chip package structure in certain embodiments may also include interposers, heat sinks, and/or other suitable components.

Conductive bumps or conducting material, such as pads, bumps, and/or metal layers, as described herein can be formed of any suitable metal, alloy, or conductive layer (e.g., titanium copper, titanium tungsten, copper metal, etc.). A metal layer (e.g., aluminum, etc.) can be deposited on the active (e.g., top) surface of a chip to form a pad. For example, the pad can be formed by any suitable processing step (e.g., sputtering, plating, etc.). In one example, a metal layer can be formed by sputtering a titanium metal layer above the exposed pad inside a through-hole or opening, sputtering a tungsten metal layer on the titanium metal layer, and sputtering a copper metal layer on the tungsten metal layer. In this way, inner circuitry of the chip can be protected from corrosion or other potentially harmful factors.

Various other structures and processes can be supported for fabricating metal layer, pads, bumps, and/or other structures described herein. For example, a metal layer can include a titanium/nickel/silver (Ti/Ni/Ag) tri-metal alloy that may be formed using chemical vapor deposition (CVD), atomic layer deposition (ALD), sputtering, electro-deposition, and/or other suitable techniques. In other examples, metal layers may be screen-printed, adhesively attached, and/or otherwise bonded to a pad or other structure, such as one or more metal layers can be deposited to form a bump.

In particular embodiments, bumps can be any suitable material (e.g., tin, copper, gold, nickel, etc.), and in some cases the cross-sectional shape of the bump can have a top portion that is wider than a base portion. Other sorts of electrically conductive couplers (e.g., bumps, balls, etc.) can be utilized in particular embodiments, such as those having a shape that is configurable for a given application or package. For example, a given bump can include a solder bump, a gold bump, a copper pillar bump, and/or other suitable electrically conductive coupler. As used herein, the term "solder" can generally refer to a fusible metal alloy with a melting point in the range of from about 90° C. to about 450° C. Examples of a solder include alloys of at least some of copper, tin, lead, silver, zinc, and/or other suitable metals.

Various types of integrated circuits can be formed in chip 704, and may have external connections via bumps 302, 731, and/or 732. Chip 704 can include any suitable type of integrated circuit device. For example, chip 704 can include one or more of metal-oxide-semiconductor field-effect transistors (MOSFETs), junction gate field-effect transistors (JFETs), laterally diffused MOS (LDMOS) transistors, insulated gate bipolar transistors, capacitors, and/or other suitable electrical components. In other examples, chip 704 can include other suitable types of electrical and/or mechanical components.

Figure 8:
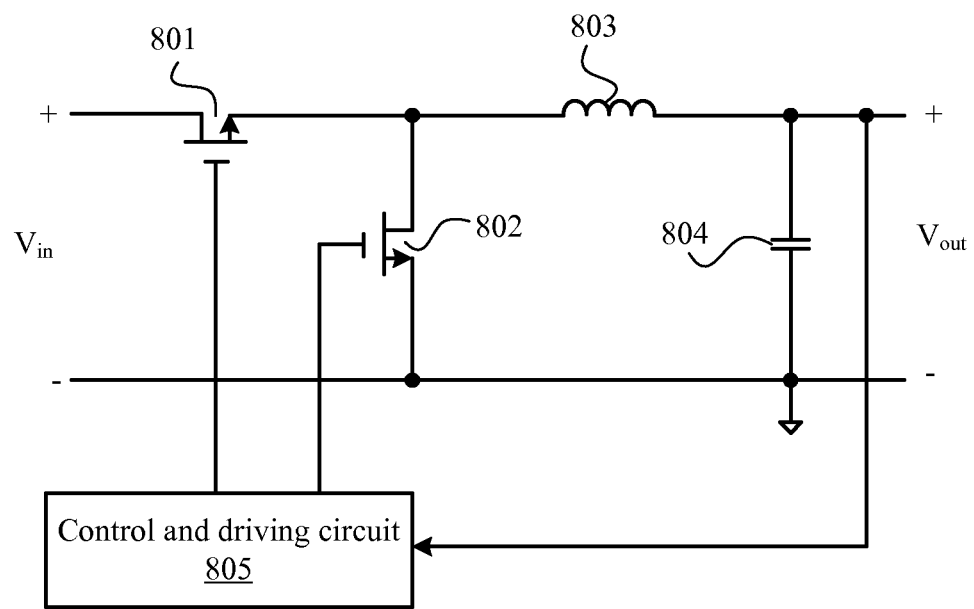
FIG. 8 is a schematic diagram of an example switching voltage regulator, suitable for use in accordance with embodiments of the present invention.

Referring now to FIG. 8, shown is a schematic diagram of an example switching voltage regulator that may represent just one example of circuitry formed within chip 704. In this example, power transistor 801, power transistor 802, inductor 803, and capacitor 804 can form a synchronous buck power stage circuit. In other cases, other types of power stage or converter circuits (e.g., flyback, SEPIC, boost, buck-boost, etc.) can be formed. Control and driving circuit 805 (e.g., including a pulse-width modulation [PWM] controller) can receive an output signal of the power stage circuit, to form a closed-loop feedback control loop to control the switching state of power transistors 801 and 802. In this way, the output signal of the power stage circuit can be controlled to be substantially constant.

The packaging structure as described herein, as well as multiple chip packaging structures, can be employed for this type of power circuitry. For example, power transistors 801 and 802 can be integrated into a single chip, and control and driving circuit 805 can be integrated into another chip, and then the two chips can be encapsulated essentially in parallel or otherwise stacked or arranged in the packaging structure.

Of course, other integration or grouping of circuitry into different chips or ICs can be accommodated in particular embodiments. In one example, a multi-chip packaging structure in particular embodiments can include power transistor 801 and power transistor 802 being integrated into a power device chip, and control and driving circuit 805 being integrated into a control chip. The power device chip can be placed directly on the printed-circuit board (PCB) or lead frame, such that the area of the power device chip can be as close to the area of the chip carrier as possible. Since the power device may process a high voltage and/or a high current, the power device chip with a large area can be able to withstand a relatively high voltage and a relatively high current. Also, the power device may have better thermal characteristics for power supply integration.

For the integrated circuit of the switching voltage regulator shown in FIG. 8, if the carrying capacity of power transistor 802 is greater than that of power transistor 801, power transistor 802 may be much larger than power transistor 801. Thus, power transistor 802 (e.g., the synchronous power device) can be integrated in a single synchronous power device chip, and power transistor 801 (e.g., the main power device) as well as control and driving circuit 805 can be integrated in another single mixed chip. The synchronous power device chip can be placed on a lead frame or PCB.

The above describes various example flip chip package structures and fabrication processes. Those skilled in the art will recognize that other techniques, structures, circuit layout, and/or components can also or alternatively be applied or utilized in particular embodiments. The embodiments were chosen and described in order to best explain the principles of the invention and its practical applications, to thereby enable others skilled in the art to best utilize the invention and various embodiments with modifications as are suited to the particular use contemplated. It is intended that the scope of the invention be defined by the claims appended hereto and their equivalents.

What is claimed is:

1. A method of making a package structure, the method comprising:
   a) forming a horizontal plate and a plurality of first conductive bumps by two separate molds, wherein said horizontal plate is conductive and arranged at a bottom of a lead frame;
   b) stamping said plurality of first conductive bumps on corresponding locations of said horizontal plate;
   c) arranging a first component above and electrically connected to said horizontal plate of said lead frame by said plurality of first conductive bumps;
   d) forming a plurality of second conductive bumps on said horizontal plate outside of a region covered by said first component, wherein each of said plurality of second bumps extends to a height greater than said first component;
   e) forming a plurality of third conductive bumps on said plurality of second conductive bumps; and
   f) arranging a second component above said first component and electrically connecting said second component to said plurality of third conductive bumps.

2. The method of claim 1, wherein said first component comprises a chip.

3. The method of claim 1, wherein said second component comprises a magnetic component.

4. The method of claim 1, further comprising an adhesive layer arranged between said first and second components.

5. The method of claim 1, wherein each of said plurality of first, second, and third conductive bumps comprises a spherical shape.

6. The method of claim 1, wherein each of said plurality of first, second, and third conductive bumps comprises copper material.

7. The method of claim 1, wherein each of said plurality of first, second, and third conductive bumps comprises a rectangular shape.

8. The method of claim 1, wherein each of said plurality of first, second, and third conductive bumps comprises a cylindrical shape.

9. The method of claim 1, wherein each of said plurality of first, second, and third conductive bumps comprises tin material.

10. The method of claim 1, wherein each of said plurality of first, second, and third conductive bumps comprises nickel material.

* * * * *